United States Patent [19]

Funatsu

[11] 4,420,874
[45] Dec. 20, 1983

[54] METHOD OF PRODUCING AN IIL SEMICONDUCTOR DEVICE UTILIZING SELF-ALIGNED THICKENED OXIDE PATTERNS

[75] Inventor: Tsuneo Funatsu, Kawasaki, Japan

[73] Assignee: Fujitsu Limited, Kawasaki, Japan

[21] Appl. No.: 340,286

[22] Filed: Jan. 18, 1982

Related U.S. Application Data

[62] Division of Ser. No. 105,152, Dec. 19, 1979, Pat. No. 4,375,645.

[30] Foreign Application Priority Data

Dec. 30, 1978 [JP] Japan .................................. 53-165804

[51] Int. Cl.[3] ..................... H01L 21/20; H01L 21/302
[52] U.S. Cl. ............................. 29/576 W; 29/577 C; 29/578; 29/580; 148/175; 148/187; 156/647; 156/648; 156/653; 156/657; 357/50; 357/54; 357/55; 357/92
[58] Field of Search .............. 29/576 W, 577 C, 578, 29/580; 148/175, 187; 156/647, 648, 649, 653, 657, 662; 357/50, 55, 92, 54

[56] References Cited

U.S. PATENT DOCUMENTS

| | | | |
|---|---|---|---|
| 3,878,552 | 4/1975 | Rodgers | 357/50 X |
| 3,904,450 | 9/1975 | Evans et al. | 357/92 X |
| 4,231,057 | 10/1980 | Momma et al. | 357/55 X |
| 4,233,091 | 11/1980 | Kawabe | 29/576 W |
| 4,255,207 | 3/1981 | Nicolay et al. | 29/580 X |
| 4,269,636 | 5/1981 | Rivoli et al. | 148/175 |
| 4,317,127 | 2/1982 | Nishizawa | 357/92 X |
| 4,320,411 | 3/1982 | Fukushima | 357/92 X |

FOREIGN PATENT DOCUMENTS 52-35987 3/1977 Japan ..................................... 357/92
52-155071 12/1977 Japan .

OTHER PUBLICATIONS

Wiedmann, S. K., "Injection-Coupled Memory: High-Density . . . Memory", IEEE J. Solid-State Circuits, vol. SC-8, No. 5, (Oct. 1973), pp. 332-337.
Declerq et al., "N-Groove-Isolated IIL Circuits", Electronics Letters, Mar. 18, 1976, vol. 12, No. 6, pp. 150-151.

Primary Examiner—W. G. Saba
Attorney, Agent, or Firm—Staas & Halsey

[57] ABSTRACT

An I²L type semiconductor device having an elementary region which is isolated by V-shape grooves from the other portions of the device, said semiconductor device comprising an insulating layer coating covering the surface of the semiconductor body of the device, wherein an injector region is formed under said insulating layer and surrounded by thicker portions of said insulating layer, and base regions are formed under said insulating layer between said thicker portions of said insulating layer and said V-shape grooves.

9 Claims, 48 Drawing Figures

METHOD OF PRODUCING AN IIL SEMICONDUCTOR DEVICE UTILIZING SELF-ALIGNED THICKENED OXIDE PATTERNS

This is a division of application Ser. No. 105,152 filed Dec. 19, 1979 now Pat. No. 4,375,645.

BACKGROUND OF THE INVENTION

The present invention relates to an integrated injection logic ($I^2L$) type semiconductor device and a method of producing the same. The $I^2L$ type semiconductor memory device in accordance with the present invention is used for a bipolar static random access memory (RAM) device, a logic circuit or the like.

DESCRIPTION OF THE PRIOR ART:

Prior art memory cells of the $I^2L$ type memory devices are illustrated in FIGS. 1, 2, 3 and 4. FIGS. 1 and 2 illustrate an npn coupled type memory cell, while FIGS. 3 and 4 illustrate a pnp coupled type memory cell. FIGS. 1 and 3 illustrate the structure of the memory cells, while FIGS. 2 and 4 illustrate the circuit diagrams of the memory cells.

In FIG. 1, a p+ type injector region J, a contact portion $J_w$ of said p+ type injector region, p+ type base regions B, contact portions $B_0$ and $B_1$ of said p+ type base regions, n+ type collector regions C(n+), contact portions $C_{h0}$, $C_{h1}$, $C_{s0}$ and $C_{s1}$ of said n+ type collector regions, writing-in or reading-out lines $D_0$ and $D_1$, and a word line W are illustrated. An opposite word line W- connected to the semiconductor body is not shown in FIG. 1. As illustrated in FIGS. 1 and 2, the PNP type transistors $Q_2$ and $Q_3$ are constituted by lateral bipolar transistors, each of which transistors comprises a, p type injector region J as an emitter, an n type region $N_B$ as a base and p type regions B as collectors. The NPN type transistors $Q_0$ and $Q_1$ are constituted by vertical bipolar transistors, each of which transistors comprises an n type region C(n+) as a collector, a p type base region B as a base and an n type region $N_B$, which is located under the base region B, as an emitter. Thus, both the PNP type transistors $Q_2$ and $Q_3$ and the NPN type transistors $Q_0$ and $Q_1$ have the n type region $N_B$ as a common connecting body.

In FIG. 3, a p+ type injector region J, a contact portion $J_w$ of said p+ type injector region, p+ type base regions B, contact portions $B_0$ and $B_1$ of said p+ type base regions, n+ type collector regions C(n+), contact portions $C_{h0}$ and $C_{h1}$ of said n+ type collector regions, contact portions $C'_{s0}$ and $C'_{s1}$ of emitter regions E(p+) of a lateral pnp transistor for detection, writing-in or reading-out lines $D_0$ and $D_1$, and a word line W are illustrated. An opposite word line W- is connected to the semiconductor body and is not shown in FIG. 3. As illustrated in FIGS. 3 and 4, the PNP type transistors $Q_2$ and $Q_3$ are constituted by lateral bipolar transistors, each of which transistors comprises a p type injector region J as a common emitter, an n type region $N_B$ as a, base and p type regions B as collectors. The NPN type transistors $Q_0$ and $Q_1$ are constituted by vertical bipolar transistors, each of which transistors comprises an n type region C(n+) as a collector, a p type base region B as a base and the n type region $N_B$, which is located under the base region B, as an emitter. The PNP type transistors $Q_4$ and $Q_5$ are constituted by lateral bipolar transistors, each of which transistors comprises a p type region B as a collector, an n type region $N_{BD}$ connected to the n type region B as a base and a p+ type region E(P+) as an emitter. Thus, all of the PNP type transistors $Q_2$ and $Q_3$, NPN type transistors $Q_0$ and $Q_1$ and the PNP type transistors $Q_4$ and $Q_5$ have the n type regions $N_B$ and $N_{BD}$ as a common connecting body.

In FIGS. 1, 2, 3 and 4, $B_0$, $C_{h0}$, $C_{s0}$ and $D_0$ are related to the "0" (or "1") side transistor $Q_0$, while $B_1$, $C_{h1}$, $C_{s1}$ and $D_1$ are related to the "1" (or "0") side transistor $Q_1$.

In the memory cell of FIGS. 1 and 3, since the structures of the transistors $Q_0$ and $Q_1$ of the flip-flop circuit are symmetrical, the operations of the transistors $Q_0$ and $Q_1$ of the flip-flop circuit are symmetrical. Accordingly the currents which energize the transistors $Q_0$ and $Q_1$ are caused to be precisely symmetrical, and no asymmetry in the operations of the writing-in and the reading-out of information occurs. Also, since the currents delivered from the injector region J are uniform in every direction, high injection efficiency is obtained and, accordingly, excellent operating characteristics of the flip-flop circuit are obtained.

However, in the manufacture of the memory cell of FIGS. 1 and 3 it is necessary to use a masking pattern which defines an opening in the insulation layer over the p+ type injector region through which an electrical connection between the p+ type injector and the conductor is formed. In order to avoid misalignment of the mask, it is necessary to make the size of the device large. Also, conductors for internal connections of the device occupy a predetermined volume of space in the device.

Therefore, in the prior art, it was difficult to reduce the size of an $I^2L$ type memory device.

The prior art $I^2L$ memory cell is described in, for example, "Injection-coupled Memory: A High-Density Static Bipolar Memory" by S. K. Wiedmann, IEEE Journal of Solid-state Circuits, Vol. SC-8, No. 5, October 1973, and in the Japanese Patent Application No. 51-71855 entitled "A Semiconductor Memory Device".

SUMMARY OF THE INVENTION

The present invention has been proposed in order to solve the problems in the prior art semiconductor memory devices set forth above.

It is the principal object of the present invention to reduce the size of an $I^2L$ type memory device and increase the degree of integration of an integrated circuit for an $I^2L$ type memory device.

In accordance with the present invention, a semiconductor memory device is provided having an elementary region which is isolated by V-shape grooves from the other portions of the device, said semiconductor memory device comprising an insulation coating covering the surface of the semiconductor body of the device, predetermined portions of said insulation coating being thicker and said thicker insulating layers surrounding the central portion of said elementary region, an injector region formed under said insulating layer and surrounded by said thicker portions of said insulating layer, and base regions formed under said insulating layer between said thicker portions of said insulating layer and said V-shape grooves.

BRIEF DESCRIPTION OF THE DRAWINGS

FIG. 4 illustrates the circuit diagram of the device of FIG. 3, FIGS. 5A through 15D illustrate a process of manufacturing I²L type memory cells in accordance with an embodiment of the present invention, in which

DETAILED DESCRIPTION OF THE PREFERRED EMBODIMENTS

Figure 1:
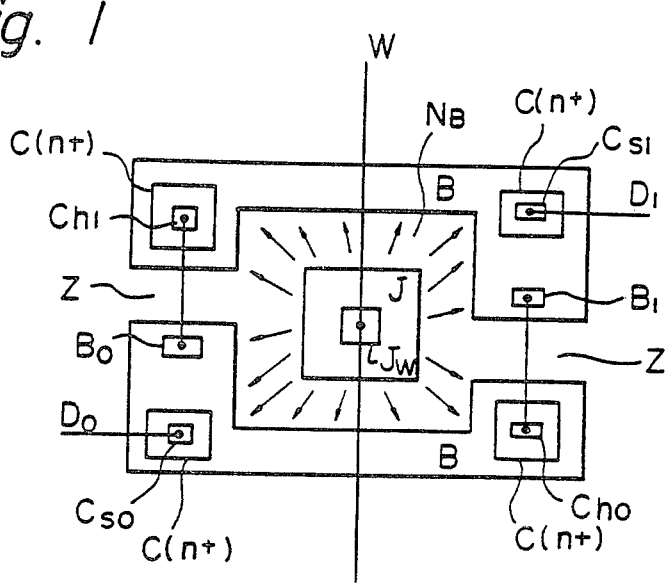
FIG. 1 illustrates the structure of a prior art $I^2L$ type memory cell of an npn coupled type.

A process of manufacturing an I²L type semiconductor memory device in accordance with an embodiment of the present invention will now be described with reference to FIGS. 5A through 15D.

As illustrated in FIGS. 5A, 5B, 5C and 5D, an n+ type layer 2 is formed in a p type silicon (Si) semiconductor substrate 1 having the Miller indices of (100) by introducing n type impurities by means of a gaseous diffusion process or an ion implantation process.

Then, an n type layer 3 of approximately 2 μm is formed by means of, for example, the gaseous epitaxial growth process. The n type layer 3 has also the Miller indices of (100).

Then, a silicon dioxide (SiO₂) layer 4 with a thickness of approximately 1400 Å is formed by means of for example, thermal oxidation process.

Then, a silicon nitride (Si₃N₄) layer 5 with a thickness of approximately 2500 Å is formed by means of, for example, the chemical vaper deposition process. This silicon nitride layer 5 acts as an anti-oxidation mask.

Then, a patterning of the silicon nitride layer 5 is effected by using, for example, the photolithographic process, so that a masking pattern is formed which covers the portion of the n type layer 3 where base regions 91, 92 and an injector region 10 (FIG. 10B) are to be formed.

As illustrated in FIGS. 6A, 6B, 6C and 6D, a photoresist layer 6 is applied to protect the portion of silicon dioxide layer 4 covering at least a portion of the surface of the n type region located between the base regions 91, 92 and the injector region 10, and a selective removal of the silicon dioxide layer 4 is effected by using the masking pattern of the silicon nitride layer 5 and the photoresist layer 6.

Figure 7A:
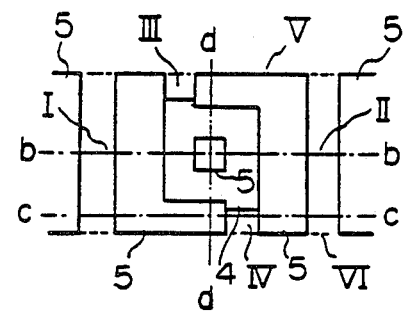
Figure 7B:
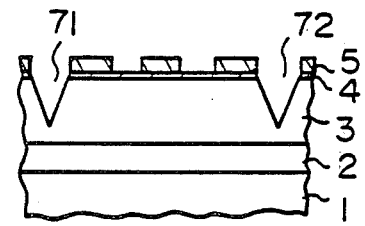
Figure 7C:
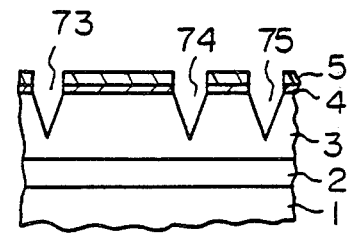
Figure 7D:
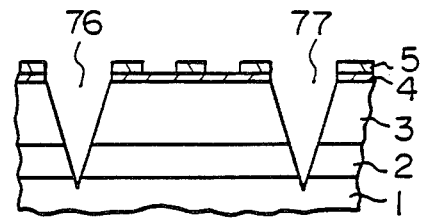

As illustrated in FIGS. 7A, 7B, 7C and 7D, after removing the photoresist layer 6, an etching of the n type layer 3 is effected by using the masking pattern of the silicon nitride layer 5 and the silicon dioxide layer 4, so that V-shape grooves 71, 72, 73, 74, 75, 76 and 77 which define the boundary of elementary regions of the device are formed. In this etching process, an anisotropic etching solution, with which the rate of the etching is greater for the plane having the Miller indices of (100) than for the other planes, is used. For this anisotropic etching solution, a solution containing, for example, potassium hydroxide (KOH) as the main constituent is used. The depth of the V-shape grooves 71, 72, 73, 74 and 75 in the regions I, II, III and IV of FIG. 7A does not extend to the boundaries of where the n type layer 3 and the n+ type layer 2 meet, due to the selection of the width of the V-shape groove at the surface of the n type layer 3, as illustrated in FIGS. 7B and 7C. However, the depth of the V-shape grooves 76 and 77 in the regions V and VI of FIG. 7A extends through the n+ type layer 2 due to the selection of the width of the V-shape groove at the surface of the n type layer 3, as illustrated in FIG. 7D.

Figure 8A:
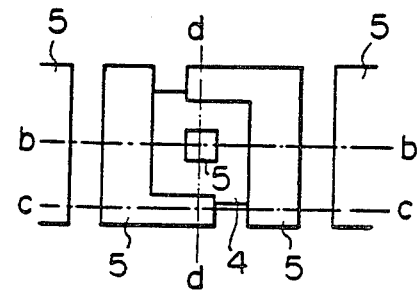
Figure 8B:
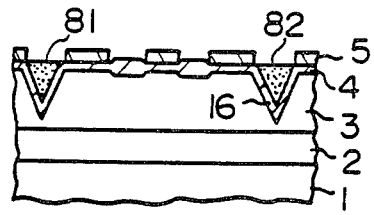
Figure 8C:
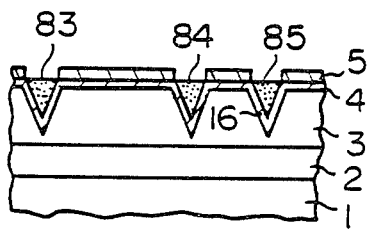
Figure 8D:
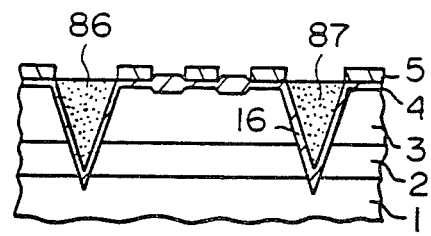

As illustrated in FIGS. 8A, 8B, 8C and 8D, a silicon dioxide layer 16 is formed on the inner surface the V-shape grooves 71, 72, 73, 74, 75, 76 and 77 by means of, for example, a thermal oxidation process. The thickness of the silicon dioxide layer 16 is approximately 3000 Å to 5000 Å. At the same time, the thickness of the portions of the silicon dioxide layer 4 which are not covered by a silicon nitride layer and not occupied by V-shape grooves is increased. Then, a polycrystalline silicon layer is formed on the silicon dioxide layer and silicon nitride layer by means of, for example, chemical vaper deposition process, and then said polycrystalline silicon layer is polished chemically and mechanically by using a polishing solution containing potassium hydroxide and aluminum oxide (Al₂O₃) as the main constituents. This polishing is completed when the silicon nitride layer 5 reveals itself from said polycrystalline silicon layer which is being polished, so that the polycrystalline silicon layers 81, 82, 83, 84, 85, 86 and 87 are maintained only in the V-shape grooves 71, 72, 73, 74, 75, 76 and 77, as illustrated in FIGS. 8B, 8C and 8D.

Figure 9A:
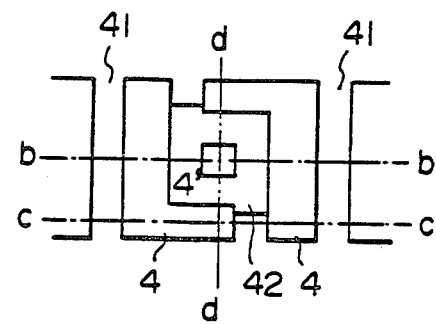
Figure 9B:
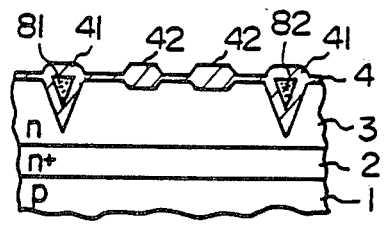
Figure 9C:
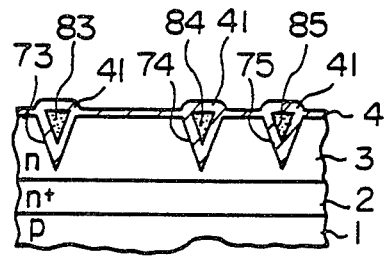
Figure 9D:
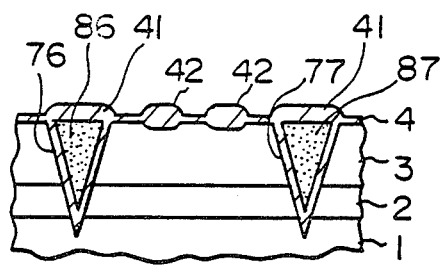

As illustrated in FIGS. 9A, 9B, 9C and 9D, silicon dioxide layers 41 are formed on the surfaces of the polycrystalline silicon layers 81, 82, 83, 84, 85, 86 and 87 and the thickness of the portions of the silicon dioxide layer 4 which are not covered by the silicon nitride layer 5 are enlarged by using the thermal oxidation process. The thicker portions 42 of the silicon dioxide layer 4 are illustrated in FIGS. 9B and 9D. The silicon dioxide layer 42 has a thickness of approximately 7000 Å to 12000Å. Then, the silicon nitride layer 5 is removed.

As illustrated in FIGS. 10A, 10B, 10C and 10D, p type base regions 91 and 92 and a p type injector region 10 are formed by introducing, for example, boron (B) by means of, for example, the ion implantation process. It is also possible to form these p type base regions and a p type injector region below the thin portions of the silicon dioxide layer by applying, for example, the solid to solid diffusion process for a long duration.

Figure 10A:
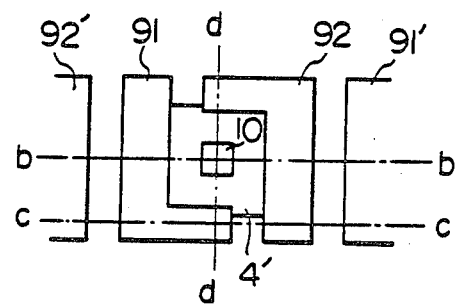
Figure 10B:
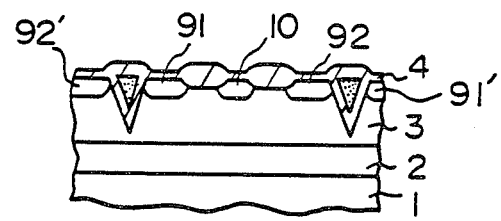
Figure 10C:
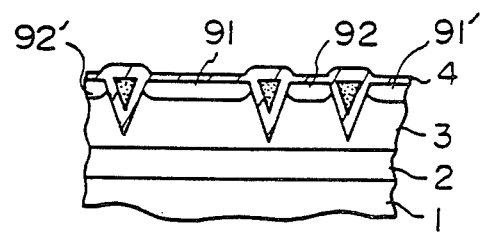
Figure 10D:
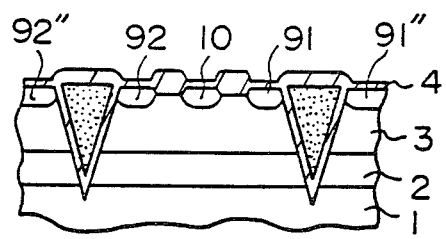
Figure 11A:
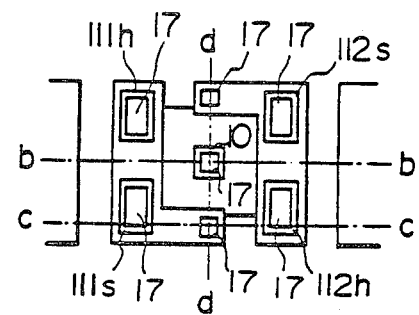
Figure 11B:
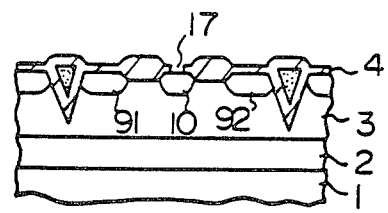
Figure 11C:
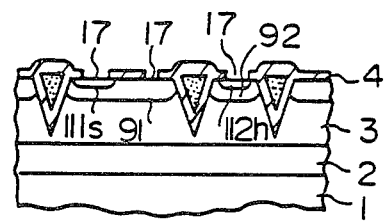
Figure 11D:
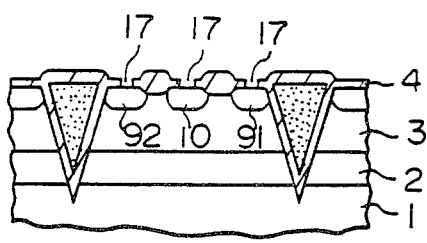
Figure 12A:
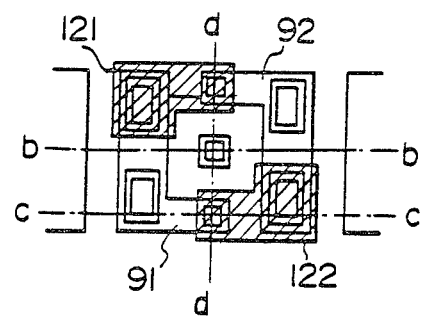
Figure 12B:
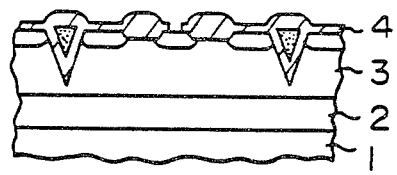
Figure 12C:
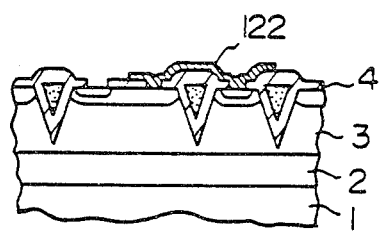
Figure 12D:
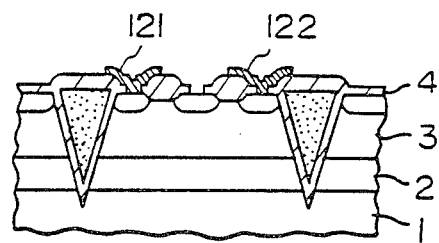
Figure 13A:
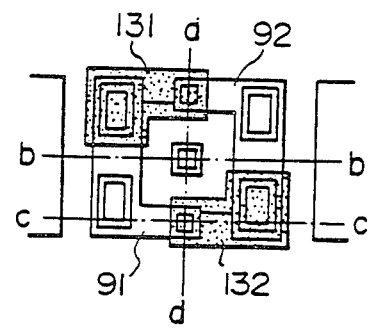
Figure 13B:
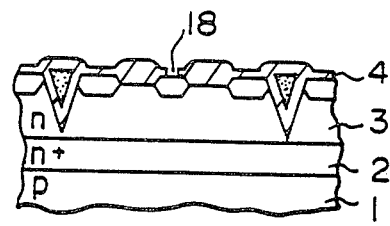
Figure 13C:
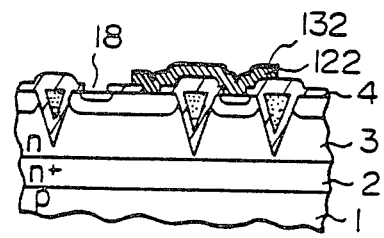
Figure 13D:
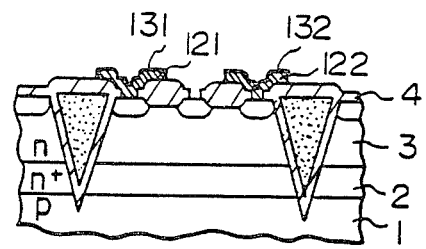
Figure 14A:
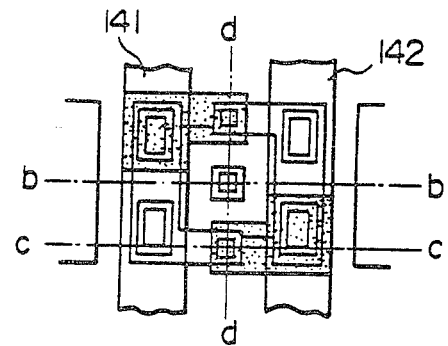
Figure 14B:
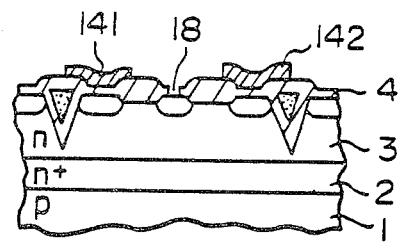
Figure 14C:
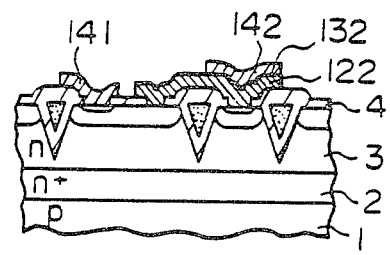
Figure 14D:
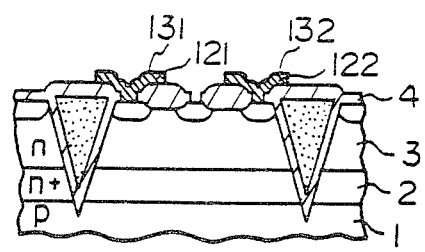
Figure 15A:
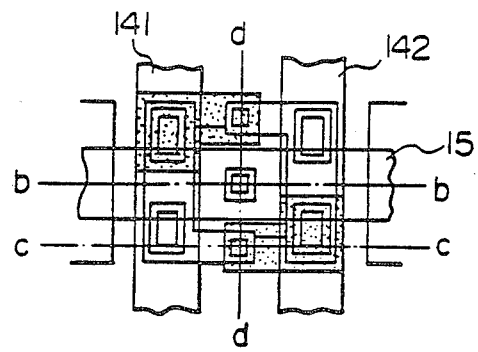
Figure 15B:
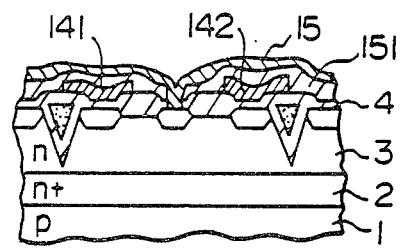
Figure 15C:
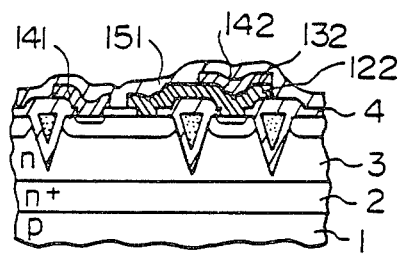
Figure 15D:
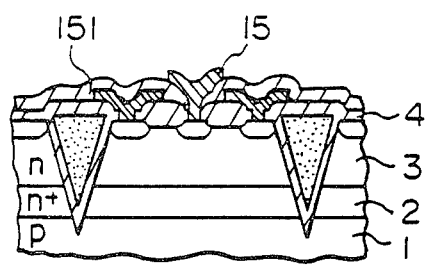

P type base regions 91', 92' of the adjacent memory cells on the same word line are illustrated in FIGS. 10A, 10B and 10C. Base regions 91", 92" of the memory cells on the adjacent word lines are illustrated in FIG. 10D.

As illustrated in FIGS. 11A, 11B, 11C and 11D, n type emitter regions $111_h$, $111_s$, $112_h$ and $112_s$ are formed in the base regions 91 and 92 by introducing n type impurities for example, arsenic (As) or phosphorus (P), by means of an ion implantation process or a gaseous diffusion process with a masking pattern. Said gaseous diffusion is effected through windows which are formed in the silicon dioxide layer 4 by means of a patterning process with a masking pattern. The emitter regions $111_h$ and $112_h$ constitute HOLD side emitters, while the emitter regions $111_s$ and $112_s$ constitute SELECT side emitters. Then windows 17 for providing conduction paths to electrodes are formed in the silicon dioxide layer 4 by means of the patterning process with the photolithographic process.

Figure 2:
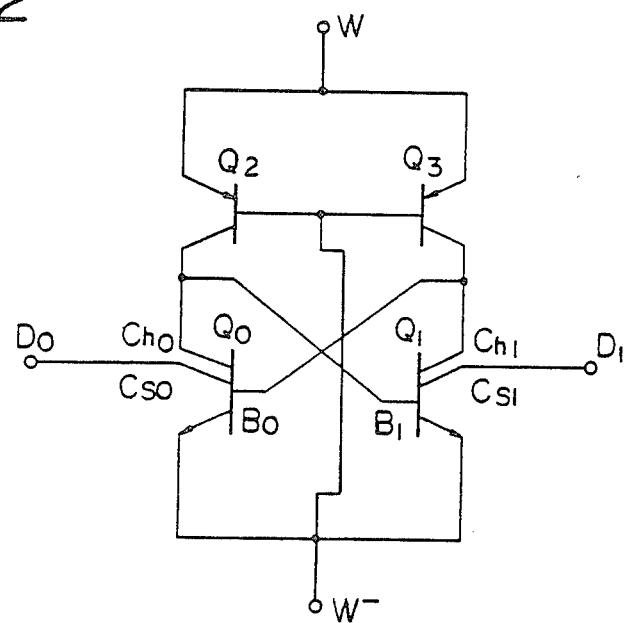
FIG. 2 illustrates the circuit diagram of the device of FIG. 1.
Figure 3:
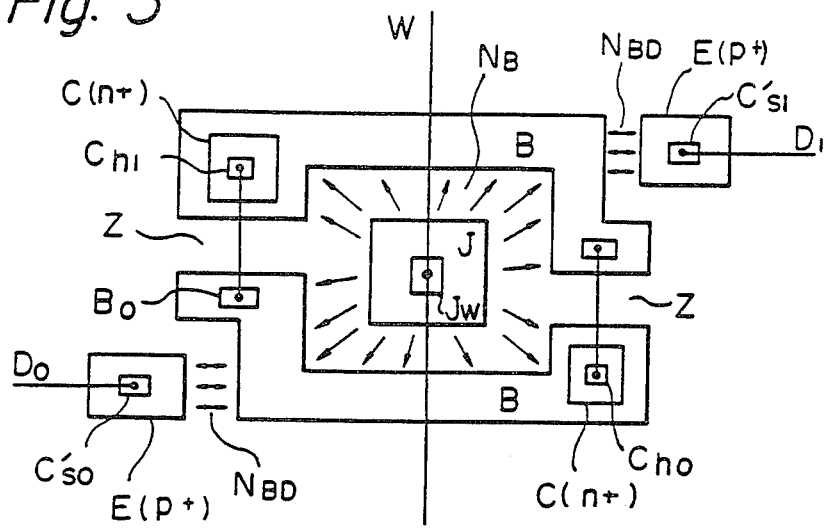
FIG. 3 illustrates the structure of a prior art $I^2L$ type memory cell of a pnp coupled type.
Figure 4:
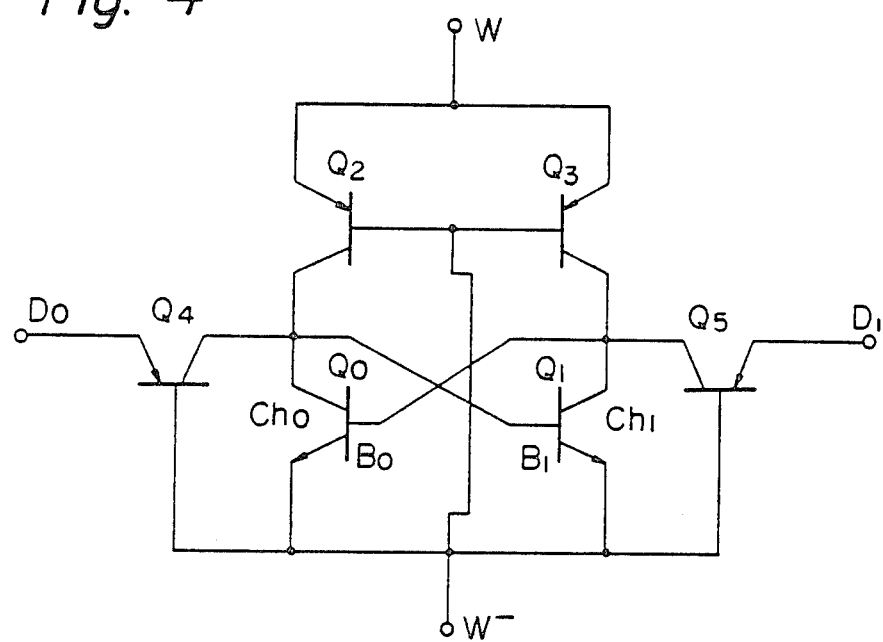
Figure 5A:
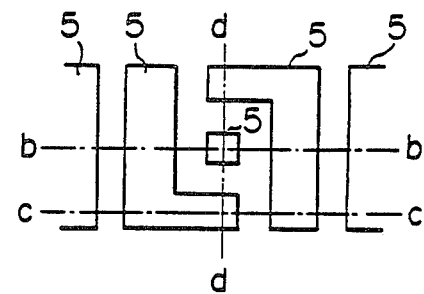
FIGS. 5A, 6A, 7A, 8A, 9A, 10A, 11A, 12A, 13A, 14A and 15A illustrate the plan views of the device in the steps of the manufacturing process.
Figure 5B:
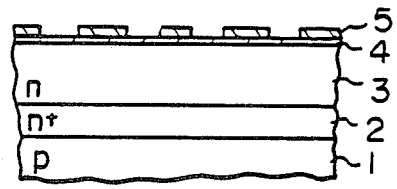
FIGS. 5B, 6B, 7B, 8B, 9B, 10B, 11B, 12B, 13B, 14B and 15B illustrate the cross-sectional views of the device taken along the lines b—b in FIGS. 5A through 15A, respectively.
Figure 5C:
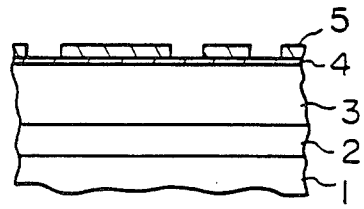
FIGS. 5C, 6C, 7C, 8C, 9C, 10C, 11C, 12C, 13C, 14C and 15C illustrate the cross-sectional views of the device taken along the lines c—c in FIGS. 5A through 15A, respectively.
Figure 5D:
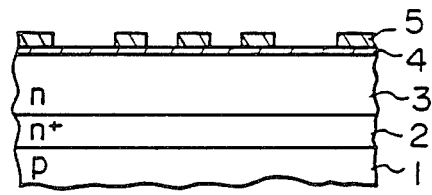
FIGS. 5D, 6D, 7D, 8D, 9D, 10D, 11D, 12D, 13D, 14D and 15D illustrate the cross-sectional views of the device taken along the lines d—d in FIGS. 5A through 15A, respectively.
Figure 6A:
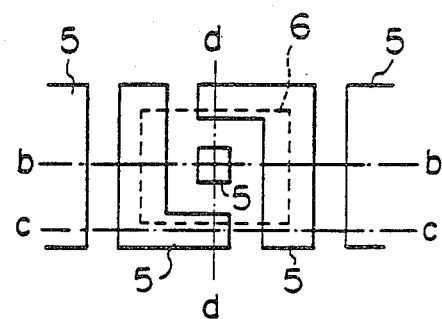
Figure 6B:
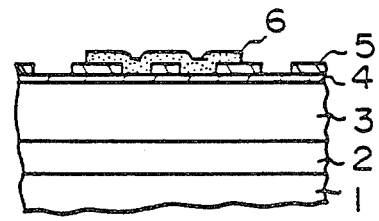
Figure 6C:
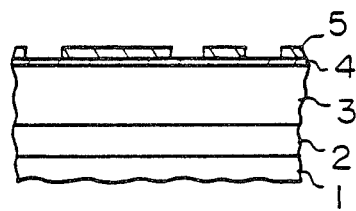
Figure 6D:
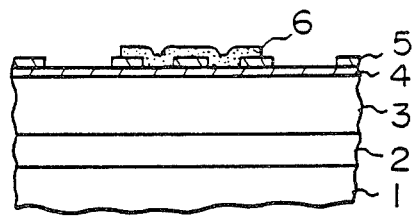

As illustrated in FIGS. 12A, 12B, 12C and 12D, an aluminum (Al) layer with a thickness of approximately 1000 to 3000 Å is deposited on the surface of the device by means of, for example, the vapor deposition process, and then electrode conductors 121 and 122 of a first wiring layer are formed by means of the patterning process with a photolithographic process applied to said aluminum layers. These electrode conductors 121 and 122 do not need to be exposed on the surface of the device. These electrode conductors 121 and 122 correspond to the cross coupling conductors connecting the bases of the transistors $Q_0$ and $Q_1$ to the collectors of the transistors $Q_2$ and $Q_3$, respectively, in the prior art devices of FIGS. 2 and 4.

As illustrated in FIGS. 13A, 13B, 13C and 13D, aluminum oxide ($Al_2O_3$) layers 131 and 132 are formed on the electrode conductors 121 and 122 by means of an anodic oxidation process in which, for example, a solution of ammonium borate is used with a voltage of 100 V. The aluminum oxide layer has a thickness of approximately 200 to 500 Å. Silicon dioxide layers, which were formed on the windows in which no conductors are filled, are removed from the portions 18 by means of, for example, the washing process.

As illustrated in FIGS. 14A, 14B, 14C and 14D, an aluminum layer with a thickness of approximately 8000 to 12000 Å is deposited on the surface of the device by means of, for example, a vapor deposition process, and then electrode conductors 141, 142, of a second wiring layer are formed by means of the patterning process with the photolithographic process applied to said aluminum layer. The electrode conductors 141 and 142 constitute digit lines connected to the SELECT side emitter regions $111_s$ and $112_s$. Electrode conductors 141 and 142 are arranged on the cross coupling conductors 121 and 122. The oxide layers 131 and 132 on the cross coupling conductors 121 and 122 prevent a short circuit between the cross coupling conductors 121 and 122 and the electrode conductors 141 and 142.

As illustrated in FIGS. 15A, 15B, 15C and 15D, an insulating layer 151 is formed to cover the electrode conductors and the exposed insulating layer. The insulating layer 151 of, for example, phosphosilicate glass is formed by, for example, a chemical vapor deposition process with thickness of approximately 8000 to 10000 Å. A window is formed in the insulating layer 151 corresponding to the position 18 by means of an ordinary photolithographical process. Then, an aluminum layer with a thickness of approximately 8000 to 12000 Å is deposited on the surface of the insulating layer 151 by means of, for example, a vapor deposition process. And then, an electrode conductor 15 of third wiring layers are formed by means of the patterning process with the photolithographic process applied to the aluminum layer. The electrode conductor 15 constitutes a word line. Sufficient widths and reduced resistivity are obtained in the above described structures of the wiring. Accordingly, the speed of the $I^2L$ memory device can be increased. A sequence of memory cells, which are located on the portion of the $n^+$ type layer 2, defined between the deep V-shape grooves 76 and 77, is connected commonly to the $n^+$ type layer acting as an opposite word line ($W^-$).

A passivation is effected by coating the surface of the memory cell array with a layer of phosphosilicate glass and the like, though such a layer is not illustrated in the drawings.

The ordinary V-shape grooves 71, 72, 73, 74 and 75 prevent parasitic pnp effects which might occur between the adjacent base regions in a memory cell or between the adjacent memory cells having the same opposite word line ($W^-$) mentioned above.

It should be noted that the locations of the base regions 91 and 92 and the injector region 10 in the structure of FIGS. 15A, 15B, 15C and 15D have been determined by the patterning of the silicon nitride layer 5 in the structure of FIGS. 5A, 5B, 5C and 5D, because the locations of the V-shape grooves 71, 72, 73, 74, 75, 76 and 77 and the thicker portions 42 in the structure of FIGS. 9B, 9C and 9D have been determined by the patterning of the silicon nitride layer 5 in the structure of FIGS. 5A, 5B, 5C and 5D. Accordingly, in accordance with the process illustrated in FIGS. 5A through 15D, the injector region and the base regions are formed in the manner of so-called "self-alignment". This makes it possible to reduce the size of the device and increase the degree of integration of the integrated circuit of the device. Also, in accordance with the process illustrated in FIGS. 5A through 15D, the electrode conductors of the second wiring layer can be formed on the portion in which the electrode conductors of the first wiring layer are buried. This also makes it possible to increase the degree of integration of the integrated circuit of the device.

The above described explanations of an embodiment of the present invention mainly refer to the structure and the process of the production of an $I^2L$ memory cell. However, a control circuit such as an address decoder and the like for controlling said $I^2L$ memory cell can also be formed on the semiconductor body on which said $I^2L$ memory cell is formed. Circuits such as a bipolar transistor logic circuit, an $I^2l$ logic circuit and the like for forming said control circuit can have the above described V-shape groove structure as a means for isolating the circuit elements. Also, the structure and the process of the production of an $I^2L$ memory cell described above can be applied not only to an $I^2L$ memory cell but also to semiconductor devices including the $I^2L$ memory cell.

What is claimed is:
1. A method for producing a semiconductor device with plural elementary regions comprising the steps of
  forming an insulating layer on a semiconductor body of a first conductivity type,
  selectively forming an anti-oxidation mask layer on said insulating layer, patterning said anti-oxidation mask layer so as to determine the locations of a plurality of pairs of first regions of opposite conductivity type, and a corresponding plurality of injector regions of the opposite conductivity type, in said semiconductor body in each said elementary region,
  forming shallow and deep V-shape grooves extending in respectively different directions in said semiconductor body, said deep V-shape grooves isolating each adjacent pair of elementary regions in a first direction and said shallow V-shape grooves extending transversely to said first direction and terminating at a depth in said semiconductor body to isolate each adjacent pair of said first regions,
  enlarging the thickness of predetermined portions of said insulating layer, said predetermined portions separating each said injector region from the corresponding pair of first regions, removing said anti-oxidation mask layer, and forming said pairs of first regions and said injector regions under said insulating layer in said semiconductor body at said locations determined by the patterning of the anti-oxidation mask layer.

2. The method of claim 1 wherein said anti-oxidation mask layer is made of silicon nitride.

3. A method for producing a semiconductor device with plural elementary regions, comprising the steps of forming a first semiconductor layer of a first conductivity type on a semiconductor substrate of the opposite conductivity type, forming a first insulating layer on said first semiconductor layer, selectively forming a second insulating layer on said first insulating layer, forming both deep and shallow V-shape grooves extending in respectively different directions to surround each said elementary region, using said first and second insulating layers as masks, said deep V-shape grooves extending into said substrate to isolate adjacent pairs of said elementary regions in a first direction, forming insulating layers on the inner surfaces of said V-shape grooves, selectively thickening portions of said first insulating layer on the surface of the semiconductor body using said second insulating layer as a mask, and forming regions of said opposite conductivity type in the first semiconductor layer using said thickened portions of said first insulating layer as a mask wherein said shallow V-shape grooves are formed so as to isolate only between the regions of opposite conductivity type of adjacent pairs of said elementary regions along a direction transverse to said first direction.

4. A method for producing a semiconductor device having plural elementary regions and a semiconductor substrate of a first conductivity type, said method comprising the steps of forming at least one first semiconductor layer of opposite conductivity type on said semiconductor substrate, said substrate and layer(s) comprising a semiconductor body, forming a first insulating layer on said first semiconductor layer(s), forming a patterned second insulating layer on said first insulating layer to define plural elementary regions, forming both shallow and deep V-shape grooves extending in respective directions in the portions of the semiconductor body to surround each said elementary region by using said first and second insulating layers as masks, said deep V-grooves extending to said substrate to isolate between adjacent pairs of said elementary regions along a first of said respective directions, forming insulating layers on the inner surfaces of said V-shape grooves, thickening portions of said first insulating layer on the surface of the semiconductor body in each said elementary region by using said second insulating layer as a mask, and forming regions of said first conductivity type in the top portion of said semiconductor body in said elementary regions by using said thick portions of said first insulating layer as a mask, wherein said shallow V-shape grooves extend to a depth so as to isolate only between adjacent pairs of said regions of said first conductivity type along a direction transverse to said first direction.

5. A method for producing a semiconductor device with plural elementary regions, said method comprising the steps of providing a semiconductor substrate of a first conductivity type, forming at least one layer of the opposite conductivity type on said semiconductor substrate to form a semiconductor body, forming a first insulating layer on said layer(s) of opposite conductivity type, selectively forming a second insulating layer on said first insulating layer to define a plurality of elementary regions, forming both deep and shallow V-shape grooves extending in respective directions in the portions of the semiconductor body to surround each said elementary region by using said first and second insulating layers as masks, said deep V-shape grooves extending in a first of said respective directions and into said substrate to a sufficient depth to isolate between adjacent pairs of said elementary regions in a first direction, forming insulating layers on the inner surfaces of said V-shape grooves, thickening portions of said first insulating layer on the surface of the semiconductor body in said elementary regions by using said second insulating layer as a mask, forming regions of said first conductivity type in the semiconductor body in said elementary region by using the thickened portions of said first insulating layer as a mask, forming selectively regions of the opposite conductivity type in said regions of first conductivity type, and forming electrode conductors to selectively connect to said regions of said first and opposite conductivity types wherein said shallow V-shape grooves extend along a direction transverse to said first direction and into the surface of said device to a depth sufficient to isolate between adjacent pairs of said regions of first conductivity type.

6. The method of claim 1, 3, 4 or 5 wherein said first insulating layer comprises silicon dioxide.

7. The method of claim 1, 3, 4 or 5 wherein said second insulating layer comprises silicon nitride.

8. The method of claim 1, 3, or 5 further comprising the step of forming polycrystalline silicon in said V-shape grooves.

9. The method of claim 1, 3, 4 or 5 wherein said first insulating layer having said thickened portions comprises silicon dioxide.

* * * * *

UNITED STATES PATENT AND TRADEMARK OFFICE
CERTIFICATE OF CORRECTION

PATENT NO. : 4,420,874
DATED : 20 December 1983
INVENTOR(S) : Funatsu

It is certified that error appears in the above-identified patent and that said Letters Patent is hereby corrected as shown below:

Col. 1, line 35, "a," should be --a common--;

line 51, "E(p+)" should be --$E(p^+)$--;

line 59, "a," should be --a--.

Col. 2, line 2, "E(P+)" should be --$E(p^+)$--.

Col. 3, line 42, "vaper" should be --vapor--.

Col. 4, line 14, after "surface" insert --of--;

line 60, after "impurities" insert --,--.

Col. 6, line 38, "$I^2 1$" should be --$I^2 L$--.

Signed and Sealed this

Twenty-fourth Day of April 1984

[SEAL]

Attest:

GERALD J. MOSSINGHOFF

Attesting Officer     Commissioner of Patents and Trademarks

UNITED STATES PATENT AND TRADEMARK OFFICE
CERTIFICATE OF CORRECTION

PATENT NO. : 4,420,874
DATED : 20 December 1983
INVENTOR(S) : TSUNEO FUNATSU

It is certified that error appears in the above-identified patent and that said Letters Patent is hereby corrected as shown below:

Col. 1, line 59, "a," should be changed to --a common--.

Signed and Sealed this

Seventh Day of August 1984

[SEAL]

Attest:

GERALD J. MOSSINGHOFF

Attesting Officer     Commissioner of Patents and Trademarks